(12) United States Patent
Xu et al.

(10) Patent No.: US 11,597,031 B2
(45) Date of Patent: Mar. 7, 2023

(54) METHODS OF OPERATING A WIRE BONDING MACHINE, INCLUDING METHODS OF MONITORING AN ACCURACY OF BOND FORCE ON A WIRE BONDING MACHINE, AND RELATED METHODS

(71) Applicant: Kulicke and Soffa Industries, Inc., Fort Washington, PA (US)

(72) Inventors: Hui Xu, Chalfont, PA (US); Wei Qin, Ambler, PA (US); D. Matthew Odhner, Bryn Athyn, PA (US)

(73) Assignee: Kulicke and Soffa Industries, Inc., Fort Washington, PA (US)

(*) Notice: Subject to any disclaimer, the term of this patent is extended or adjusted under 35 U.S.C. 154(b) by 29 days.

(21) Appl. No.: 17/517,827

(22) Filed: Nov. 3, 2021

(65) Prior Publication Data
US 2022/0134469 A1    May 5, 2022

Related U.S. Application Data

(60) Provisional application No. 63/110,012, filed on Nov. 5, 2020.

(51) Int. Cl.
*B23K 20/00* (2006.01)
*B23K 20/26* (2006.01)
(Continued)

(52) U.S. Cl.
CPC ............ *B23K 20/007* (2013.01); *B23K 20/26* (2013.01); *B23K 2101/40* (2018.08); *H01L 24/85* (2013.01);
(Continued)

(58) Field of Classification Search
CPC .. B23K 20/007; B23K 20/26; B23K 2101/40; B23K 2101/42; B23K 20/004;
(Continued)

(56) References Cited

U.S. PATENT DOCUMENTS

| 4,373,653 | A | 2/1983 | Salzer et al. |
| 5,230,458 | A | 7/1993 | Asanasavest |

(Continued)

FOREIGN PATENT DOCUMENTS

| CN | 104368912 A | * | 2/2015 | ........... B23K 26/037 |
| CN | 105590874 A | * | 5/2016 | |

(Continued)

OTHER PUBLICATIONS

International Search Report dated Feb. 22, 2022 for International Patent Application No. PCT/US2021/057820.

*Primary Examiner* — Kiley S Stoner
(74) *Attorney, Agent, or Firm* — Christopher M. Spletzer, Sr.

(57) ABSTRACT

A method of operating a wire bonding machine is provided. The method includes: (a) operating a wire bonding machine during at least one of (i) an automatic wire bonding operation and (ii) a dry cycle wire bonding operation, wherein a bonding force is applied during the operation of the wire bonding machine; and (b) monitoring an accuracy of the bonding force of the wire bonding machine during the at least one of (i) an automatic wire bonding operation and (ii) a dry cycle wire bonding operation.

34 Claims, 15 Drawing Sheets

(51) Int. Cl.
*B23K 101/40* (2006.01)
*H01L 23/00* (2006.01)

(52) U.S. Cl.
CPC ............... *H01L 2224/859* (2013.01); *H01L 2224/85035* (2013.01)

(58) Field of Classification Search
CPC ............ B23K 20/005; H01L 24/85; H01L 2224/85035; H01L 2224/859; H01L 24/48; H01L 2224/48247; H01L 2224/78251; H01L 2224/78301; H01L 2224/78901; H01L 2224/7892; H01L 2924/00014; H01L 24/78
USPC .................................. 228/180.5, 4.5, 904
See application file for complete search history.

(56) References Cited

U.S. PATENT DOCUMENTS

| | | | | |
|---|---|---|---|---|
| 6,095,396 | A * | 8/2000 | Takahashi | B23K 20/004 228/1.1 |
| 6,483,190 | B1 * | 11/2002 | Kainuma | H01L 24/14 257/737 |
| 6,564,115 | B1 * | 5/2003 | Kinnaird | H01L 24/78 700/121 |
| 2010/0108744 | A1 | 5/2010 | Qin et al. | |
| 2011/0057299 | A1 * | 3/2011 | Takata | H01L 24/48 257/676 |
| 2011/0259941 | A1 * | 10/2011 | Kim | H01L 24/78 228/104 |
| 2012/0007420 | A1 | 1/2012 | Ehuraj | |
| 2017/0125311 | A1 | 5/2017 | Shah et al. | |
| 2019/0229084 | A1 * | 7/2019 | Song | H01L 24/81 |

FOREIGN PATENT DOCUMENTS

| | | | | |
|---|---|---|---|---|
| CN | 105598613 | A * | 5/2016 | |
| CN | 108213687 | A * | 6/2018 | ............ B23K 20/10 |
| EP | 3459674 | A1 * | 3/2019 | ........... B23K 20/004 |
| JP | 4275724 | B1 * | 6/2009 | ........... B23K 20/007 |
| JP | 4343996 | B1 * | 10/2009 | ........... B23K 20/004 |
| JP | 4425319 | B1 * | 3/2010 | ........... B23K 20/005 |
| JP | 2012-074699 | | 4/2012 | |
| JP | 2015233032 | A * | 12/2015 | ............ H01L 24/85 |
| JP | 5930423 | B2 * | 6/2016 | ........... B23K 20/005 |
| WO | WO-2018038113 | A1 * | 3/2018 | ........... B23K 20/007 |

* cited by examiner

METHODS OF OPERATING A WIRE BONDING MACHINE, INCLUDING METHODS OF MONITORING AN ACCURACY OF BOND FORCE ON A WIRE BONDING MACHINE, AND RELATED METHODS

CROSS-REFERENCE TO RELATED APPLICATION

This application claims the benefit of U.S. Provisional Application No. 63/110,012, filed Nov. 5, 2020, the content of which is incorporated herein by reference.

FIELD

The invention relates to wire bonding operations, and in particular, to techniques for monitoring the accuracy of a bonding force on a wire bonding machine.

BACKGROUND

In the processing and packaging of semiconductor devices, wire bonding continues to be the primary method of providing electrical interconnection between two locations within a package (e.g., between a die pad of a semiconductor die and a lead of a leadframe). More specifically, using a wire bonder (also known as a wire bonding machine) wire loops are formed between respective locations to be electrically interconnected. The primary methods of forming wire loops are ball bonding and wedge bonding. In forming the bonds between (a) the ends of the wire loop and (b) the bond site (e.g., a die pad, a lead, etc.), various types of bonding energy may be used, including, for example, ultrasonic energy, thermosonic energy, thermocompressive energy, amongst others. Wire bonding machines (e.g., stud bumping machines) are also used to form conductive bumps from portions of wire.

Such wire bonding machines typically include a bond head assembly (i.e., a bond head) that carries a wire bonding tool (e.g., a capillary tool) that contacts a workpiece during the wire bonding operation. In connection with most wire bonding operations, a bonding force is applied to the wire bonding tool. In order to form consistent (and acceptable) wire bonds, it is important that the bonding force applied during wire bonding is accurate. However, sometimes the applied force is different from an intended (e.g., programmed) bonding force. For example, the bonding force may vary over time based on conditions such as environmental factors, hours of machine operations, amongst others.

Thus, it would be desirable to provide improved techniques for monitoring and/or controlling the bonding force on a wire bonding machine.

SUMMARY

According to an exemplary embodiment of the invention, a method of operating a wire bonding machine is provided. The method includes: (a) operating a wire bonding machine during at least one of (i) an automatic wire bonding operation and (ii) a dry cycle wire bonding operation, wherein a bonding force is applied during the operation of the wire bonding machine; and (b) monitoring an accuracy of the bonding force of the wire bonding machine during the at least one of (i) the automatic wire bonding operation and (ii) the dry cycle wire bonding operation.

According to another exemplary embodiment of the invention, a method of operating a wire bonding machine is provided. The method includes the steps of: incrementally adjusting a bonding force applied to a bond head assembly while detecting a z-height position of a portion of the bond head assembly; and determining a desired bonding force at which an incremental adjustment does not result in a change of the z-height position of the bond head assembly.

According to another exemplary embodiment of the invention, a method of operating a wire bonding machine is provided. The method includes the steps of: incrementally adjusting a bonding force applied to a bond head assembly while detecting a z-height position of a portion of the bond head assembly; and determining a desired bonding force at which an incremental adjustment from results in a peak z-height position of the bond head assembly.

According to yet another exemplary embodiment of the invention, a method of operating a wire bonding machine is provided. The method includes the steps of: incrementally decreasing a bonding force applied to a bond head assembly while detecting a z-height position of a portion of the bond head assembly, until the z-height position changes from an initial height by a predetermined height adjustment; and detecting a bonding force value upon the z-height position changing from the initial height by the predetermined height adjustment.

According to yet another exemplary embodiment of the invention, a method of operating a wire bonding machine is provided. The method includes the steps of: incrementally increasing a bonding force applied to a bond head assembly while detecting a z-height position of a portion of the bond head assembly, until the z-height position changes from an initial height by a predetermined height adjustment; and detecting a bonding force value upon the z-height position changing from the initial height by the predetermined height adjustment.

The methods of the invention may also be embodied as an apparatus (e.g., as part of the intelligence of a wire bonding machine), or as computer program instructions on a computer readable carrier (e.g., a computer readable carrier including a wire bonding program used in connection with a wire bonding machine).

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures.

DETAILED DESCRIPTION

Figure 1A:
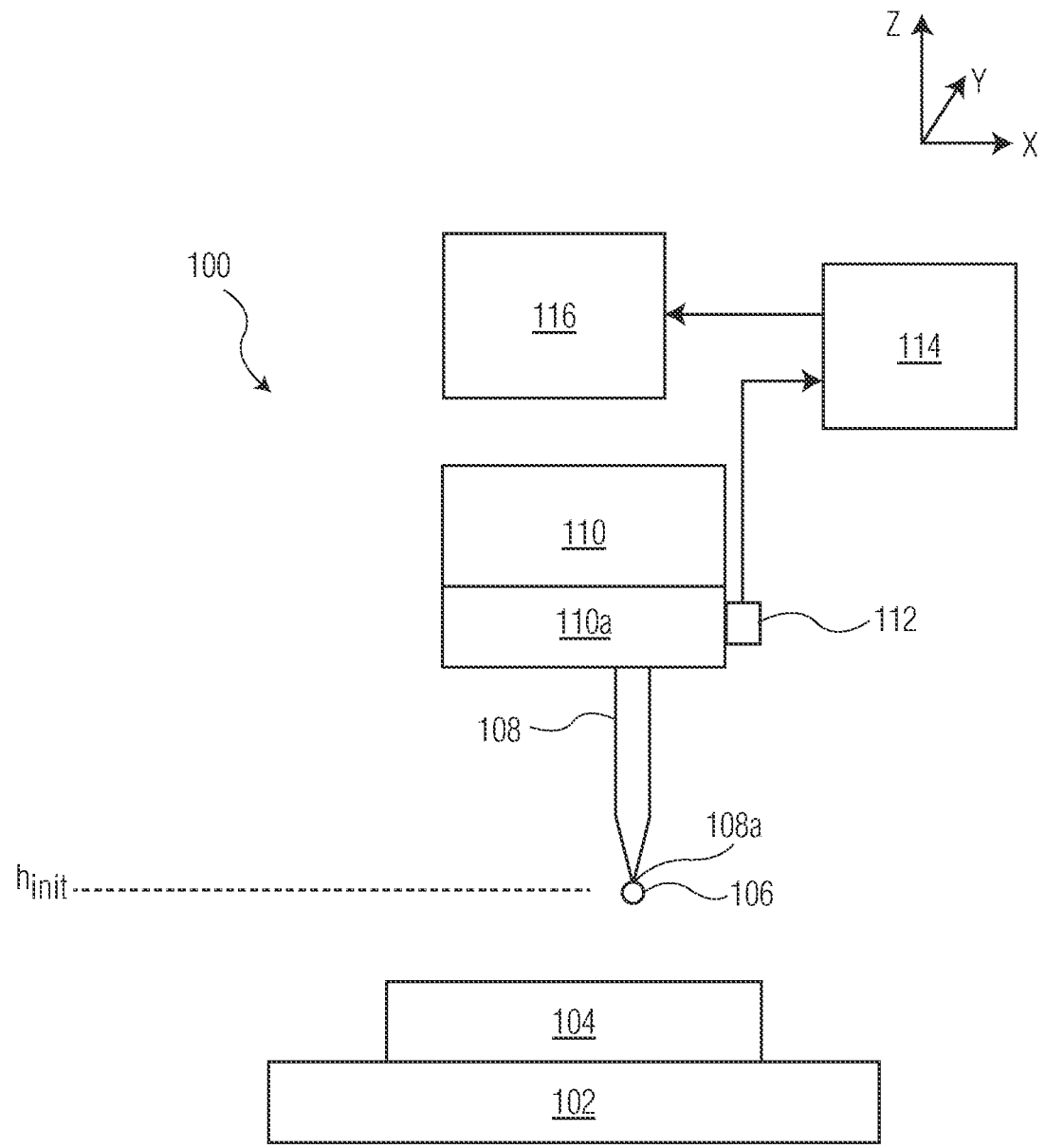
FIGS. 1A-1C are a series of block diagram side views of a wire bonding machine illustrating a method of operating a wire bonding machine in accordance with an exemplary embodiment of the invention.

In accordance with various exemplary embodiments of the invention, methods of operating wire bonding machines are provided, for example, methods of automatically verifying bonding force (sometimes referred to as bond force), and methods of monitoring bonding force in real time, on a wire bonding machine. In certain embodiments of the invention, the methods may include an automatic mode bonding force verification process and/or a closed loop bonding force adjustment process (e.g., including offset adjustments of the bonding force).

Thus, aspects of the invention relate to the monitoring and/or the automatic correction/adjustment of bonding force applied on a wire bonding machine, with the goal of achieving a desirable wire bonding performance. For example, according to aspects of the invention, the bonding force (and/or the accuracy of the bonding force) is monitored in an automatic wire bonding mode (and/or a dry cycle bonding mode), where a response may be provided if the accuracy of the monitored bonding force is not within an acceptable range (e.g., the monitored bonding force has shifted due to any reason). For example, the response may be (i) to provide an alarm, warning or error message to a machine operator; (ii) to cease operation of the wire bonding machine; (iii) to automatically adjust the bonding force of the wire bonding machine (e.g., closed loop force offset adjustment); etc.

According to certain exemplary embodiments of the invention, methods are provided for verifying the machine bonding force in automatic mode. Such methods may include applying multiple levels of bonding force, and monitoring the response of the bond head position. For example, the starting force (e.g., a pre-verified force $F_{pv}$, which may or may not be a zero gram force) may be gradually decreased in small increments until it moves up a set height (e.g., $h_a$), and then the force may be increased until it moves back down to the starting point (e.g., $h_{init}$). This force verification can be performed at dry cycle and automatic mode. The two force values (and/or additional force values such as $F_b$ within the scope of the invention) (e.g., the force value corresponding to the set height $h_a$, and the force value corresponding to the return to the starting point $h_{init}$) are recorded. If the force values do not meet the expectation (e.g., are not within an acceptable tolerance of the expected force values), a response may be provided (e.g., the response may be: to provide an alarm, warning or error message to a machine operator; to cease operation of the wire bonding machine; to automatically adjust the bonding force of the wire bonding machine to an acceptable level).

The invention provides significant advantages over past practice. Existing methods of bonding force calibration involve operators performing calibrations offline (not in automatic mode). Such calibrations tend to be time consuming, and require the removal of certain hardware parts (e.g., a flow head for reducing gas), and the installation of calibration weights. Aspects of the invention provide force verification in automatic mode with a minimal (or no) time penalty, and may also be used to provide closed loop bonding force adjustments.

Aspects of the invention relate to monitoring an accuracy of the bonding force of a wire bonding machine during at least one of (i) an automatic wire bonding operation and (ii) a dry cycle wire bonding operation. Exemplary techniques for monitoring such accuracy of the bonding force are disclosed herein. However, other techniques for accomplishing such monitoring (during at least one of an automatic wire bonding operation, and a dry cycle wire bonding operation) are contemplated within the scope of the invention.

As used herein, the term "zero gram force" is an example of an applied bonding force at which an incremental force adjustment (e.g., an increase or decrese in the bonding force) does not result in a change of the z-height position of the bond head assembly. The term "zero gram force" may also be used to refer to an applied bonding force that results in a peak height (either a high peak height or a low peak height) of a portion of a bond head assembly (e.g., force $F_b$ resulting in height $h_b$, and force $F_d$ resulting in height $h_d$, both described in connection with FIG. 4). In any case, such "zero gram force" values may be determined from a single value (e.g., see $F_b$ from FIG. 4, $F_d$ from FIG. 4, etc.). Further, a determined "zero gram force" or a determined "desired" force within the scope of the invention may utilize multiple measured values (e.g., see $F_b$ from FIG. 4, $F_d$ from FIG. 4, etc.) to determine a single force value. For example, a single force value may be determined by averaging (or otherwise mathematically manipulating) the multiple measured values from a single cycle (as in FIG. 4) or multiple cycles.

Aspects of the invention relate to detecting a bonding force applied at different height positions of a bond head assembly of a wire bonding machine. For example, a force value may be detected upon the z-height position changing from one height to another height (e.g., changing from an initial height by the predetermined height adjustment). In other aspects of the invention, height positions of a bond head assembly of a wire bonding machine are detected at different values of applied bonding force. Using such bonding force and/or height position information, the accuracy of the bonding force may be monitored.

While the invention is largely described in connection with a force control mode of a wire bonding machine, it is not limited thereto. For example, a position control mode may be utilized. In connection with such a position control mode, a characteristic of a z-axis driving force (which corresponds to a bonding force) may be determined while substantially maintaining a predetermined z-axis position to monitor the accuracy of the bonding force. Such a characteristic may be, for example, an electrical characteristic of a z-axis motor, an electrical current of a z-axis motor providing the driving force, etc.

Throughout the various drawings provided herein, the same reference numbers refer to the same element. Thus, a description of certain elements may be omitted in connection with some of the drawings.

Figure 1B:
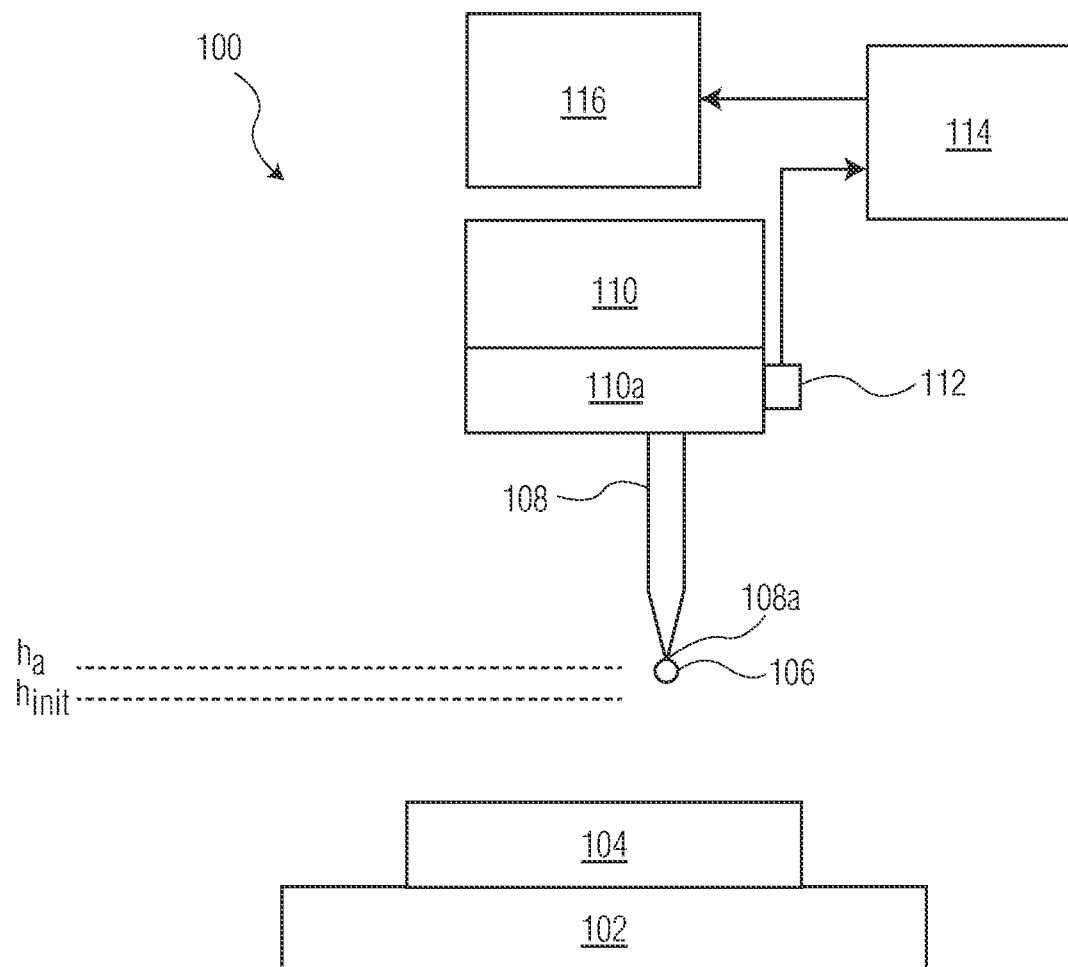
Figure 1C:
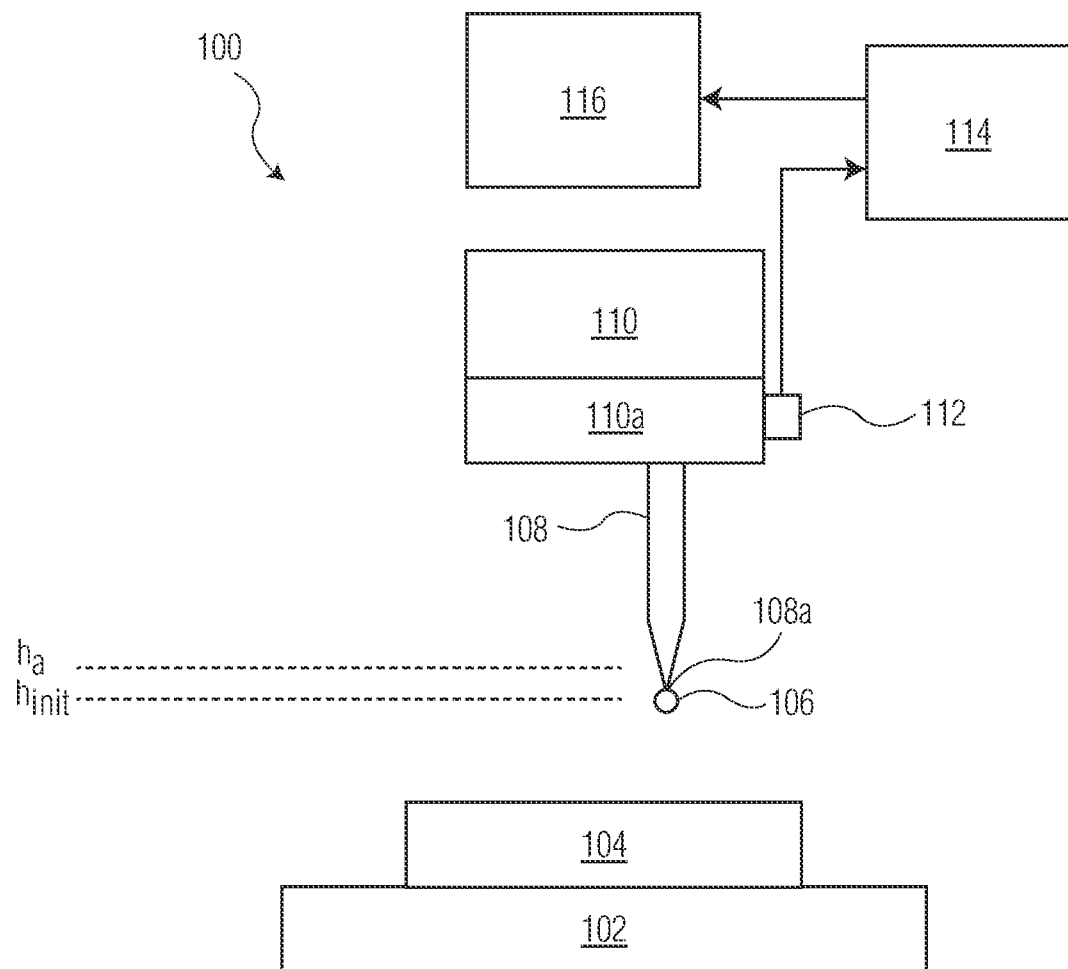

Referring now to the drawings, FIGS. 1A-1C illustrate wire bonding machine 100. Wire bonding machine 100 includes support structure 102 (e.g., a heat block, an anvil, etc.) for supporting a workpiece 104 (e.g., a semiconductor element such as a leadframe holding one or more semiconductor die) during a wire bonding operation. In FIG. 1A, wire bonding machine 100 also includes wire bonding tool 108 (e.g., a capillary wire bonding tool, a wedge bonding tool, etc.) for bonding wire portions to workpiece 104. As will be appreciated by those skilled in the art, wire bonding tool 108 (carried by bond head assembly 110) is moveable along a plurality of axes of wire bonding machine 100 to perform wire bonding operations. For example, wire bonding tool 108 may be moved along the x-axis and y-axis through movement of bond head assembly 110. A linkage 110a is provided as part of the bond head assembly 110. Linkage 110a is configured for movement along the z-axis of the wire bonding machine 100 with the bond head assembly 110, and is driven along the z-axis by z-axis motor 116 (which is controlled by computer 114 of wire bonding machine 100). A z-axis position detector 112 (e.g., a z-axis encoder) is provided that detects the z-axis position of linkage 110a (and hence a relative z-axis position of wire bonding tool 108), and provides data corresponding to this z-axis position (e.g., real time) to computer 114 of wire bonding machine 100. Thus, computer 114 has information related to the z-axis position of wire bonding tool 108 through its motions. In a force control mode, z-axis motor 116 may be used to apply bonding force in connection with wire bonding operations.

Referring specifically to FIG. 1A, free air ball 106 is seated at a working tip 108a (the contact portion) of wire bonding tool 108. In some embodiments, free air ball 106 is not required within the scope of the invention (e.g., the inventive methods may be performed with no wire portion at working tip 108a). The initial height shown in FIG. 1A is $h_{init}$ (e.g., see left side of timing diagram in FIG. 4, described below in connection with FIG. 3A). While $h_{init}$ is shown with respect to the working tip 108a of wire bonding tool 108 (adjacent free air ball 106), this is a relative height, and could be illustrated with respect to any part of bond head assembly 110 that moves along the z-axis. At this stage, a bonding force applied to the bond head assembly 110 (e.g., through z-axis motor 116) is incrementally decreased while detecting a z-height position of a portion of the bond head assembly 110 (using z-axis position detector 112), until the z-height position changes from $h_{init}$ by a predetermined height adjustment (in FIG. 1B, until it reaches height $h_a$) (e.g., see $h_a$ in the timing diagram in FIG. 4, described below in connection with FIG. 3B). During this incremental decrease in bonding force, the bonding force value is detected upon the z-height position changing from $h_{init}$ by the predetermined height adjustment shown in FIG. 1B. Then, the bonding force applied to the bond head assembly 110 is incrementally increased while detecting the z-height position of the portion of the bond head assembly 110 (using z-axis position detector 112), until the z-height position returns to $h_{init}$ as shown in FIG. 1C (e.g., see $h_{init}$ as caused by $F_c$ in the timing diagram in FIG. 4, described below in connection with FIG. 3D). During this incremental increase in bonding force, the bonding force value is detected upon the z-height position changing back to $h_{init}$ as shown in FIG. 1C. Using these detected bonding force values, the accuracy of the bonding force (e.g., including the accuracy of the zero gram force) may be monitored (e.g., the accuracy of the applied bonding force as compared to the intended (e.g., programmed) bonding force). Of course, variations, and additional process steps, may be included in this exemplary process.

Figure 2A:
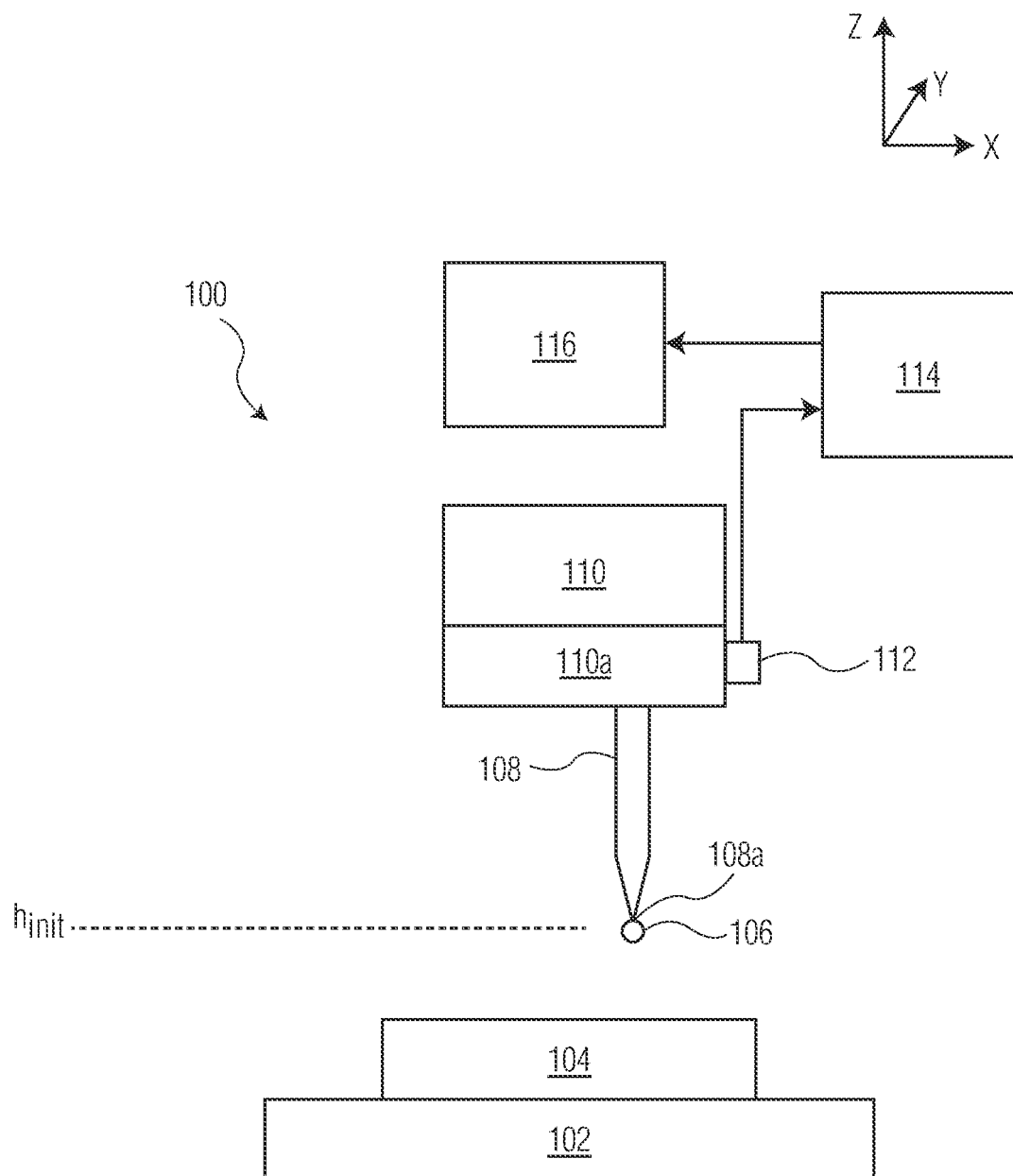
FIGS. 2A-2C are another series of block diagram side views of a wire bonding machine illustrating a method of operating a wire bonding machine in accordance with an exemplary embodiment of the invention.
Figure 2B:
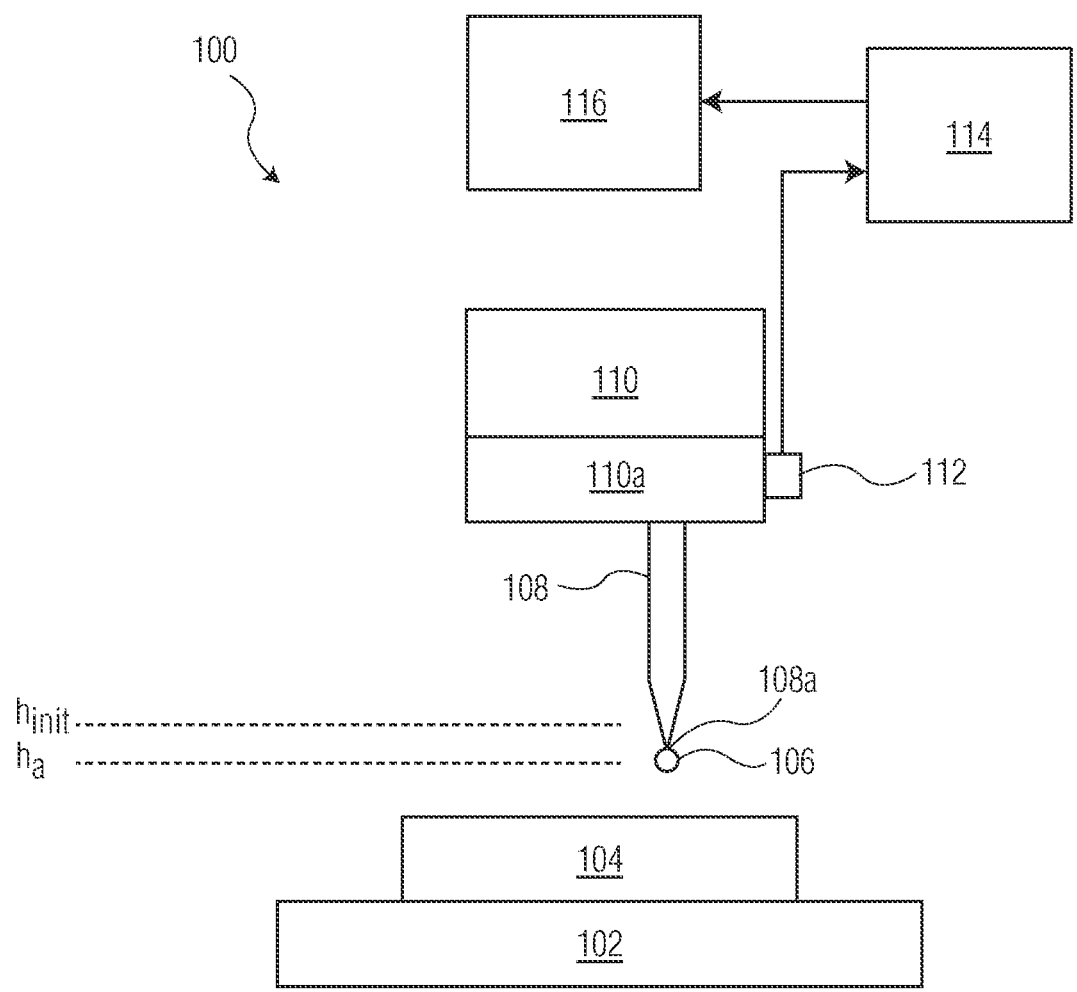
Figure 2C:
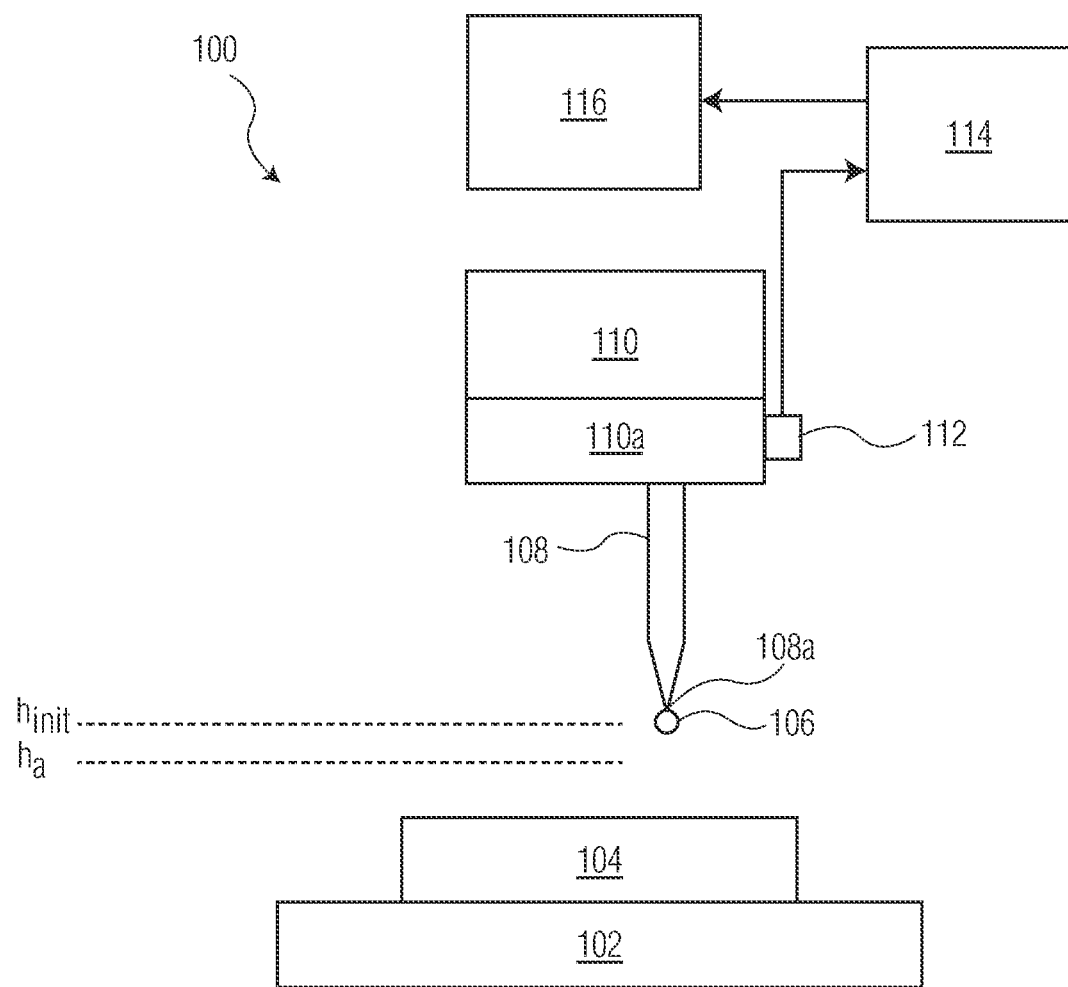

The process illustrated in FIGS. 1A-1C is just one technique for monitoring the accuracy of the bonding force (and/or method of operating a wire bonding machine). FIGS. 2A-2C illustrate another non-limiting example. Referring specifically to FIG. 2A, the initial height shown is $h_{init}$. While $h_{init}$ is shown with respect to the working tip 108a of wire bonding tool 108 (adjacent free air ball 106), this is a relative height, and could be illustrated with respect to any part of bond head assembly 110 that moves along the z-axis. At this stage, a bonding force applied to bond head assembly 110 (e.g., through z-axis motor 116) is incrementally increased while detecting a z-height position of a portion of bond head assembly 110 (using z-axis position detector 112), until the z-height position changes from $h_{init}$ by a predetermined height adjustment (in FIG. 2B, until it reaches height $h_a$). During this incremental increase in bonding force, the bonding force value is detected upon the z-height position changing from $h_{init}$ by the predetermined height adjustment shown in FIG. 2B. Then, the bonding force applied to bond head assembly 110 is incrementally decreased while detecting the z-height position of the portion of bond head assembly 110 (using z-axis position detector 112), until the z-height position returns to $h_{init}$ as shown in FIG. 2C. During this incremental decrease in bonding force, the bonding force value is detected upon the z-height position changing back to $h_{init}$ as shown in FIG. 2C. Using these detected bonding force values, the accuracy of the bonding force (e.g., including the accuracy of the zero gram force) may be monitored (e.g., the accuracy of the applied bonding force as compared to the intended (e.g., programmed) bonding force).

FIGS. 3A-3F illustrate another non-limiting example for monitoring the accuracy of the bonding force (and/or method of operating a wire bonding machine). FIG. 4 is a timing diagram illustrating a z-height position of a portion of the bond head assembly, and the bonding force applied by the bond head assembly, versus time. The timing diagram of FIG. 4 aligns with the process steps shown in FIGS. 3A-3F as described below.

Figure 3A:
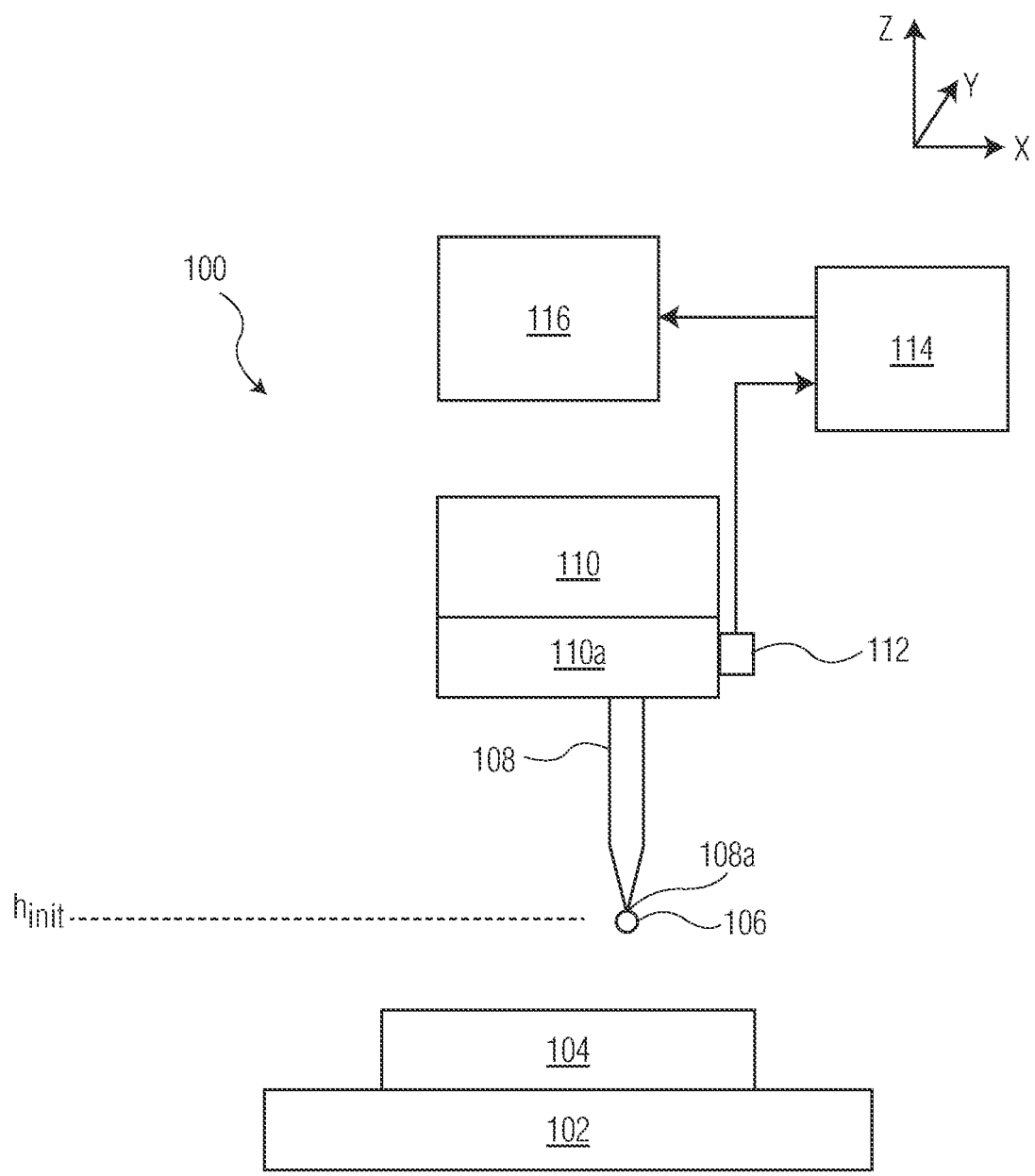
FIGS. 3A-3F are yet another series of block diagram side views of a wire bonding machine illustrating a method of operating a wire bonding machine in accordance with an exemplary embodiment of the invention.
Figure 3B:
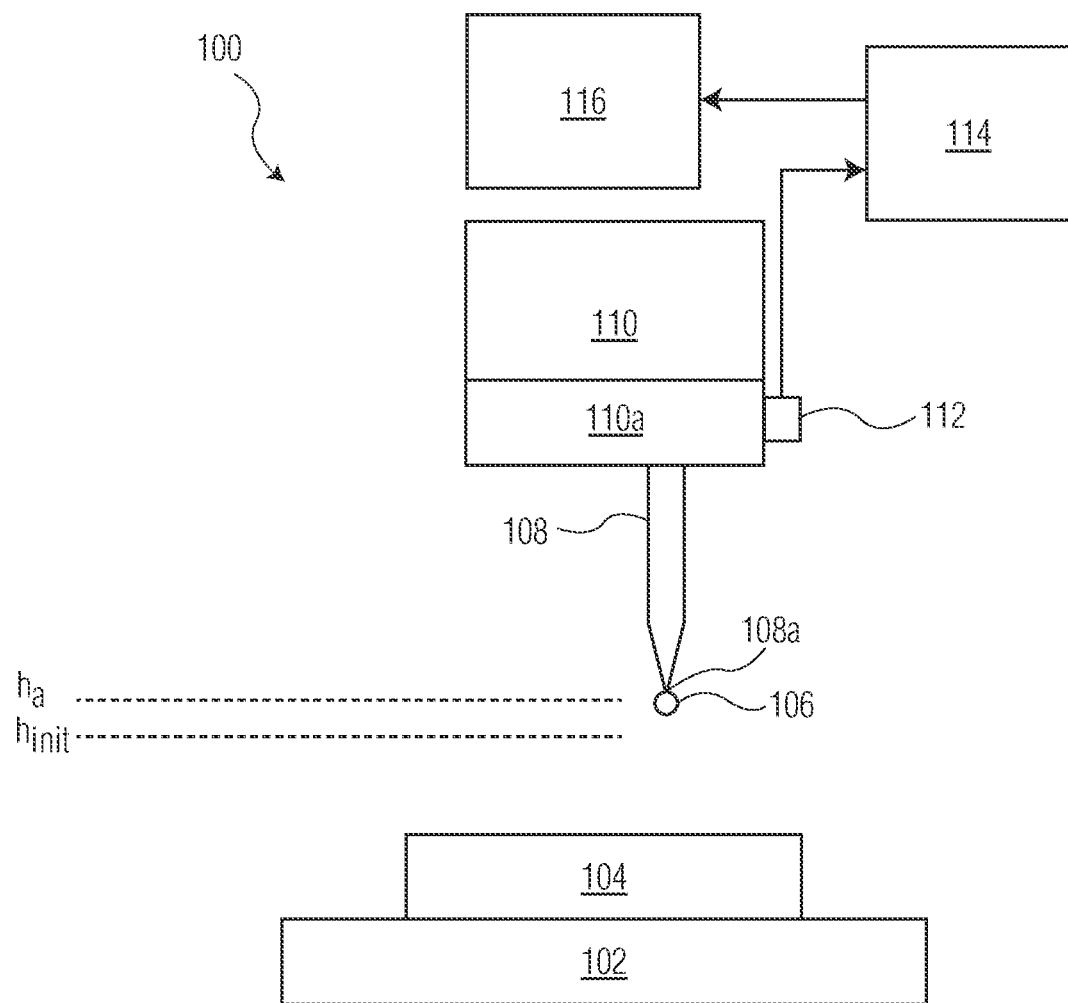
Figure 3C:
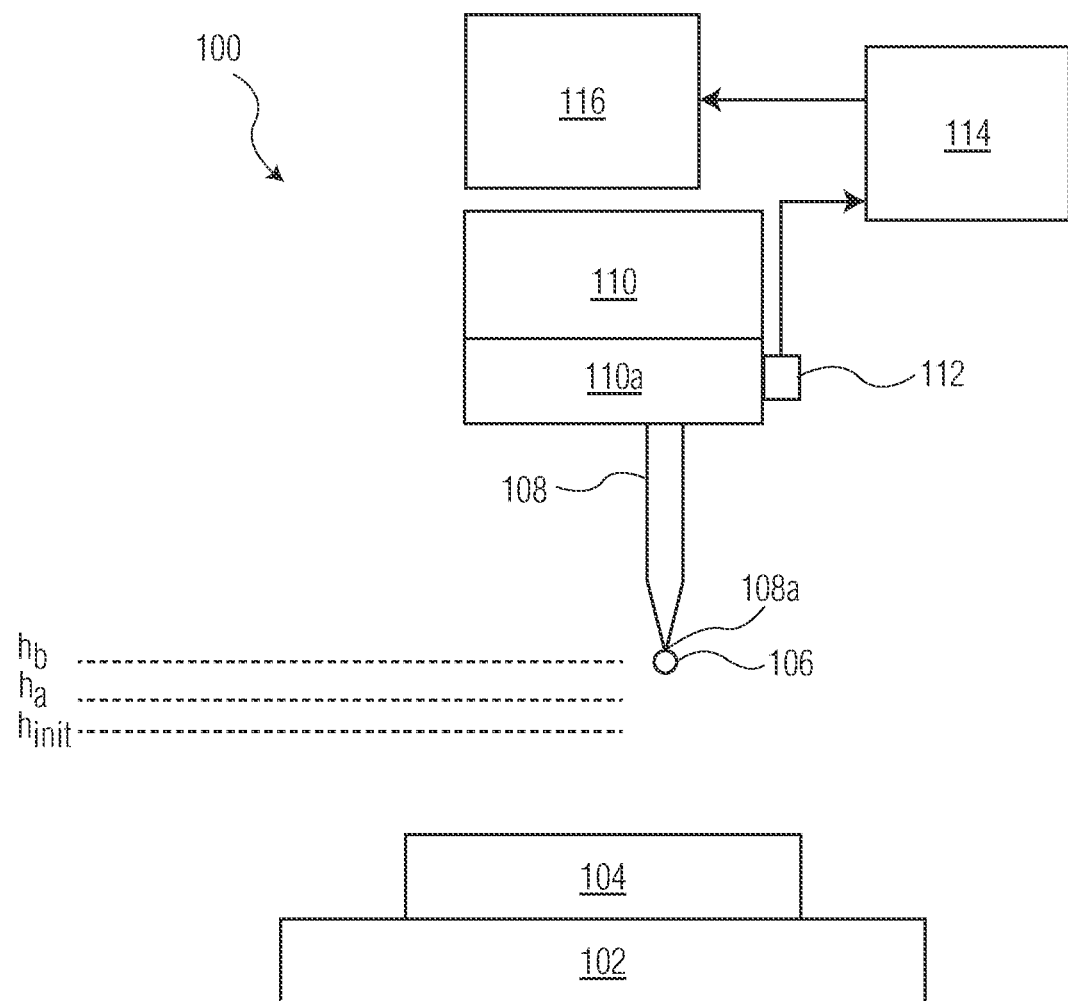
Figure 4:
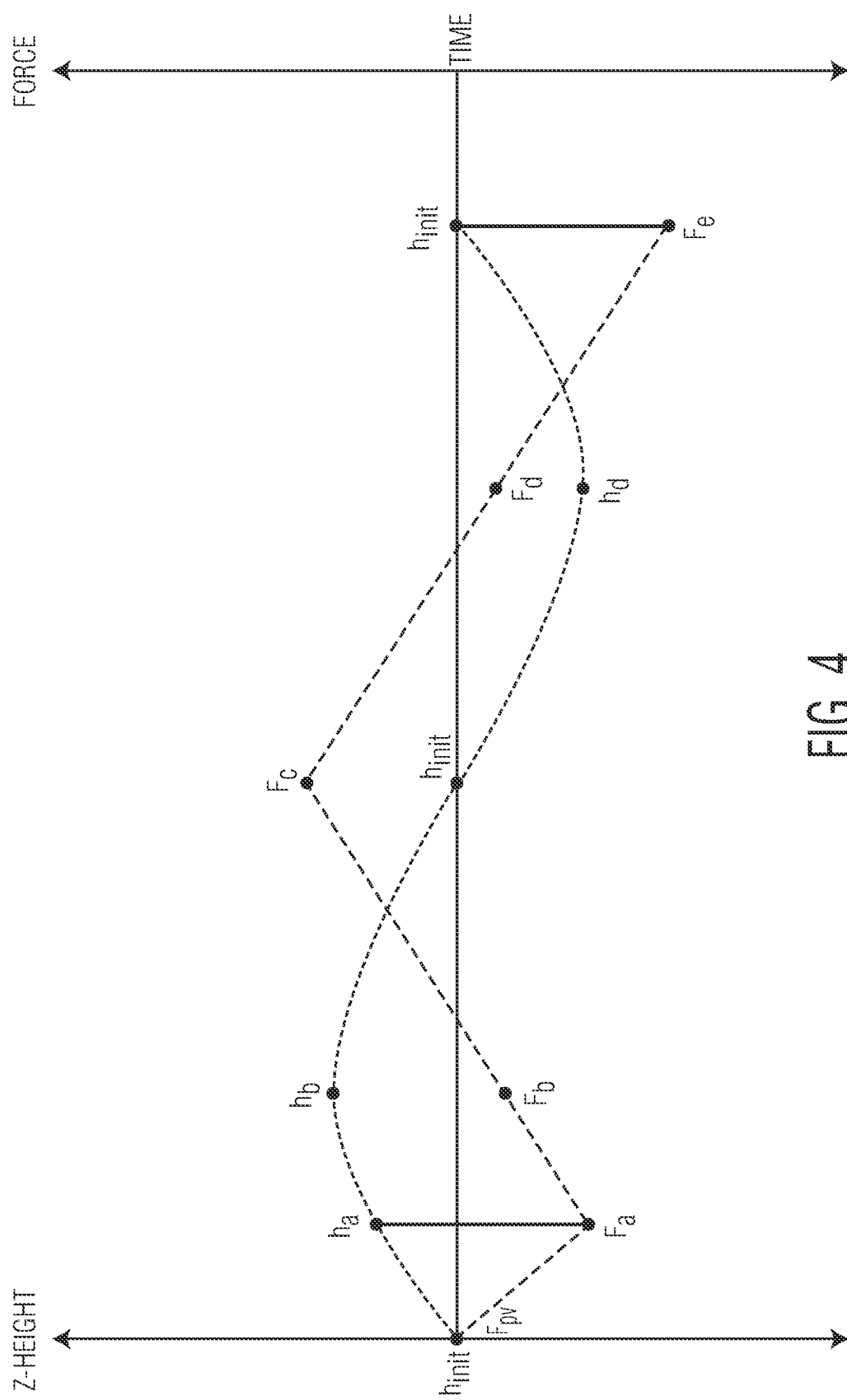
FIG. 4 is a timing diagram illustrating a z-height position of a portion of a bond head assembly, and the bonding force applied by the bond head assembly, versus time, in accordance with an exemplary embodiment of the invention.

Referring specifically to FIG. 3A, wire bonding machine 100 is illustrated with free air ball 106 at a position $h_{init}$. The force applied at this point can be described as the pre-verified zero gram force (see "$F_{pv}$" of FIG. 4). In FIG. 3B, wire bonding tool 108 is moved upward (i.e., +Z direction) to position $h_a$ as the applied force to wire bonding tool 108 is decreased (this is illustrated in FIG. 4 as the applied force changes from $F_{pv}$ and $F_a$) (See FIG. 4, where a force $F_a$ is applied, at which time the applied force begins to increase). In FIG. 3C, wire bonding tool 108 continues to move upward to a position $h_b$ even though the force is increasing (this is illustrated in FIG. 4 between points $h_a$ and $h_b$), for example, due to the momentum of bond head assembly 110. A zero gram force (e.g., force $F_b$) may be determined/monitored at this point (i.e., at height $h_b$, where the height is at a local maxima). Thus, in connection with FIG. 3C, a zero gram force may be determined in connection with an applied bonding force that results in the peak height $h_b$ (i.e., force $F_b$ resulting in height $h_b$, as described in connection with FIG. 4).

Figure 3D:
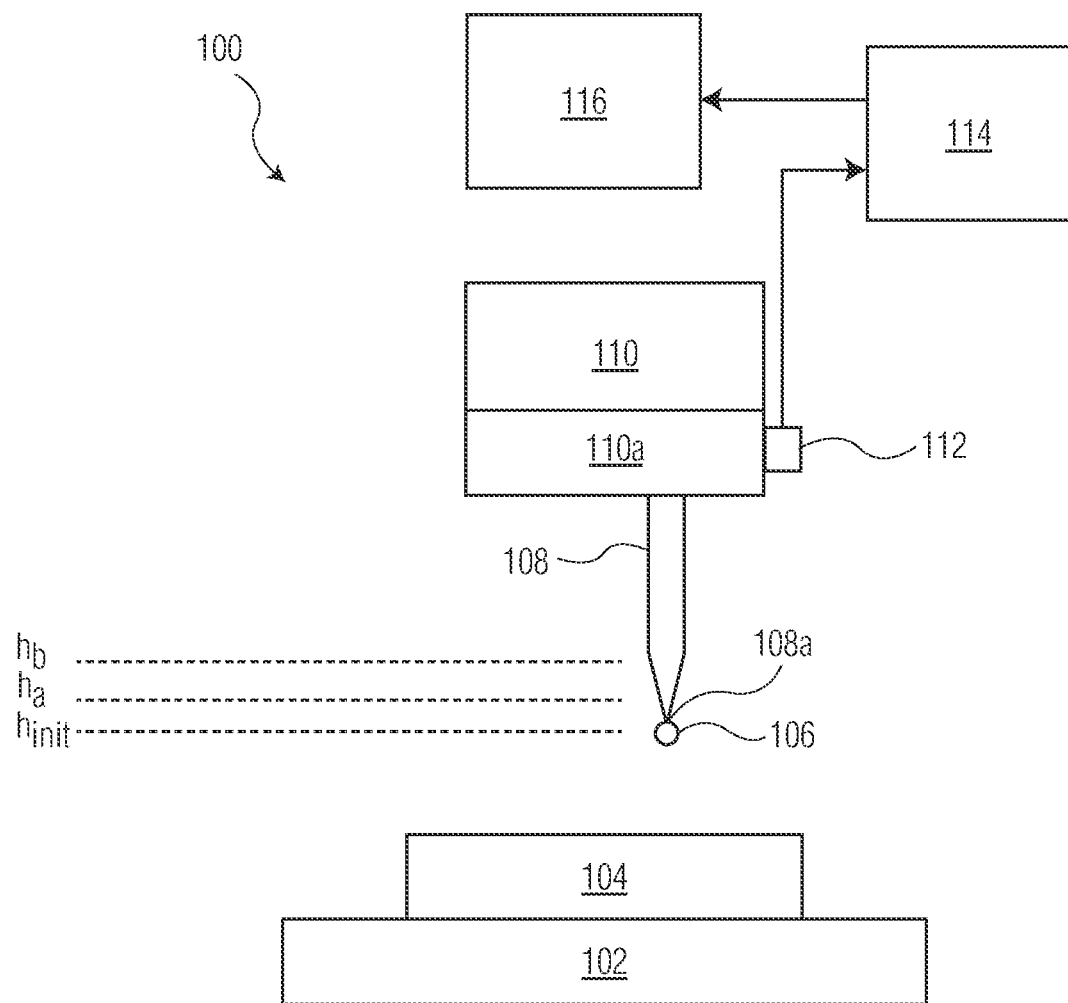
Figure 3E:
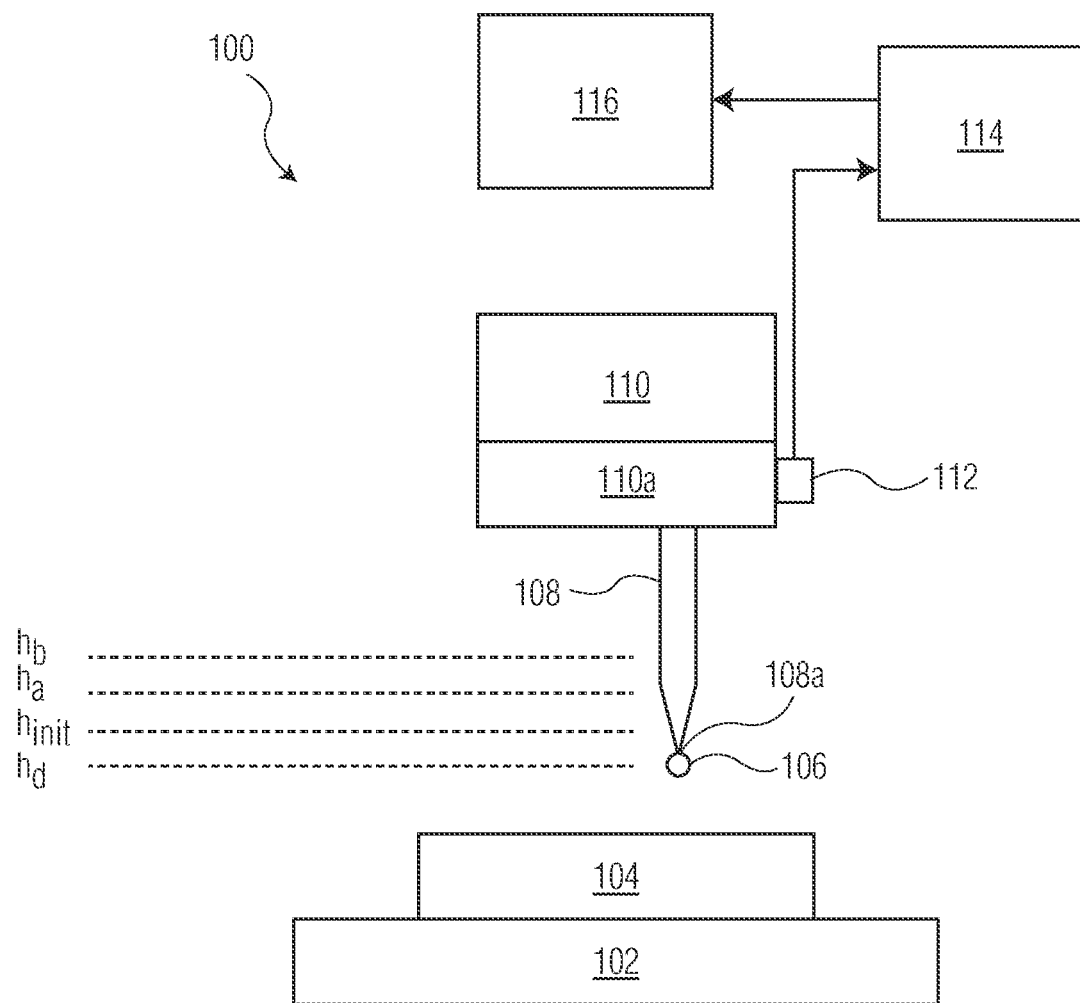

In FIG. 3D, wire bonding tool 108 is moved back to the initial position $h_{init}$ when the applied force is at its peak, $F_c$ (this is illustrated in FIG. 4 between points $F_b$ and $F_c$). In FIG. 3E, wire bonding tool 108 is moved to position $h_d$ as the applied force is being decreased (this is illustrated in FIG. 4 between points $F_c$ and $F_d$). Another zero gram force (e.g., $F_d$) may be determined/monitored at this point (i.e., $h_d$, where the height is at a local minima). That is, in connection with FIG. 3E, a zero gram force may be determined in connection with an applied bonding force that results in the peak height $h_d$ (i.e., force $F_d$ resulting in height $h_d$, as described in connection with FIG. 4).

Figure 3F:
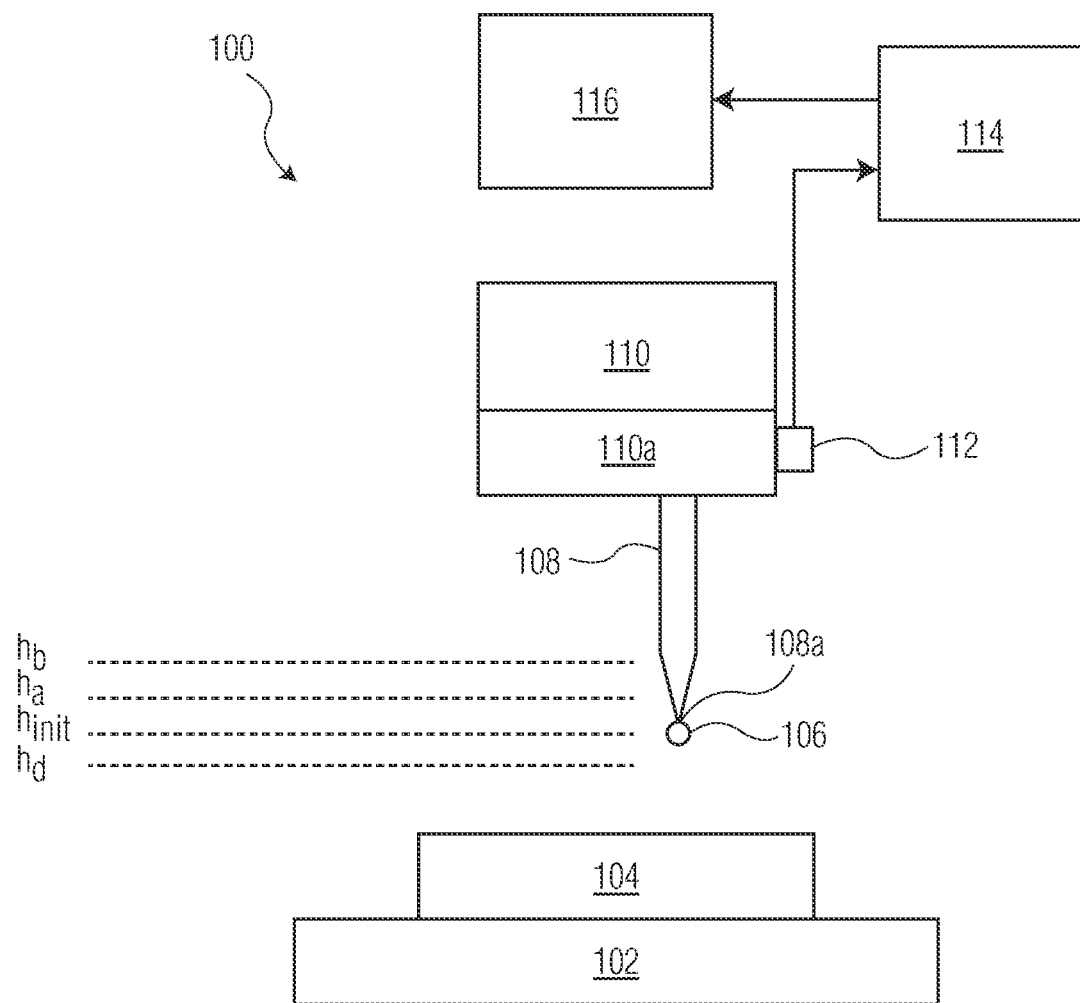

In FIG. 3F, wire bonding tool 108 moves back to position $h_{init}$ as the applied force continues to decrease (this is illustrated in FIG. 4 between points $F_d$ and $F_e$).

The timing diagram illustrated in FIG. 4 is a short duration (e.g., a single cycle), however, it is understood that this process shown in FIG. 4 (or any part thereof claimed in this application) may be repeated for a plurality of cycles until the desired result occurs (e.g., a desired bonding force is determined, a stable bonding force value is determined, an accurate zero gram force value is determined, the accuracy of the bonding force has been determined, etc.).

FIGS. 5-8 are flow diagrams illustrating methods of operating wire bonding machines (and related methods) in accordance with various exemplary embodiments of the invention. As is understood by those skilled in the art, certain steps included in the flow diagrams may be omitted; certain additional steps may be added; and the order of the steps may be altered from the order illustrated.

Figure 5:
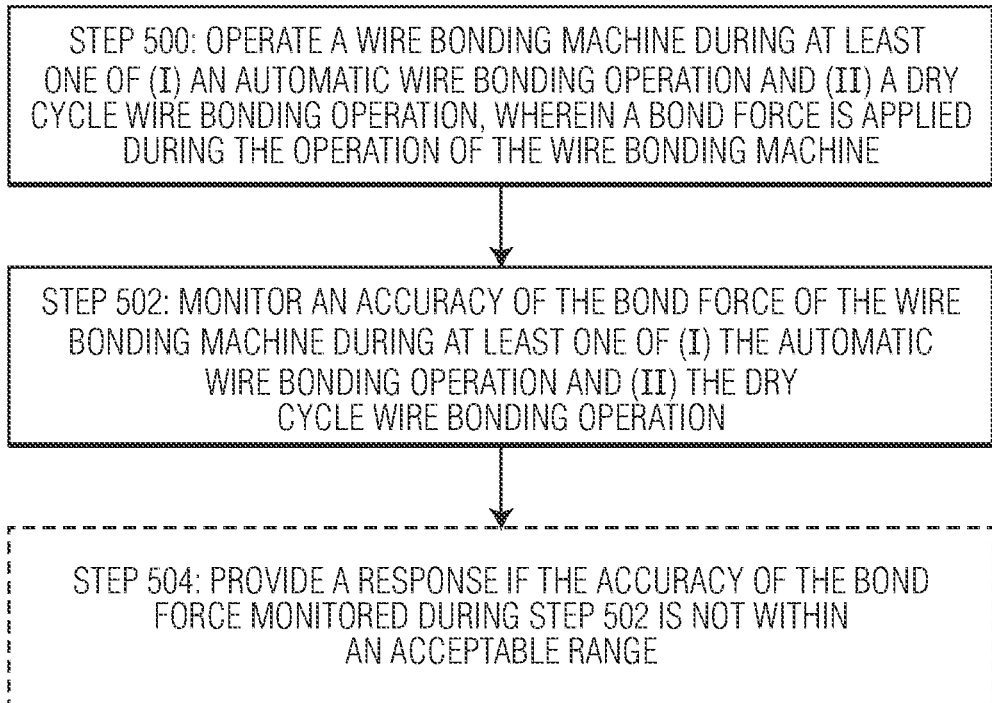
FIGS. 5-8 are flow diagrams illustrating methods of operating wire bonding machines in accordance with various exemplary embodiments of the invention.

Referring specifically to FIG. 5, a method of operating a wire bonding machine is illustrated. At Step 500, a wire bonding machine is operated during at least one of (i) an automatic wire bonding operation and (ii) a dry cycle wire bonding operation, wherein a bonding force is applied during the operation of the wire bonding machine. At Step 502, an accuracy of the bonding force of the wire bonding machine is monitored during the at least one of (i) the automatic wire bonding operation and (ii) the dry cycle wire bonding operation. For example, in Step 502, the accuracy of an applied bonding force as compared to the intended (e.g., programmed) bonding force may be monitored.

For example, Step 502 may occur during a force control mode (or a position control mode) of operation of the wire bonding machine. During Step 502, a force applied to a bond head assembly of the wire bonding machine may be incrementally adjusted (e.g., incrementally increasing a force, incrementally decreasing a force, both incrementally increasing and decreasing a force, etc.) while detecting a z-height position of a portion of the bond head assembly.

Additional aspects of the invention may also occur during Step 502. For example, an accurate zero gram force may be determined during Step 502. For example, in connection with Step 502, a desired force may be determined at which an incremental adjustment from Step 500 does not result in a change of the z-height position of the bond head assembly. Stated differently, a desired force may be determined at an applied force where an incremental adjustment from Step 500 results in a peak z-height position of the bond head assembly (e.g., force $F_b$ resulting in height $h_b$, force $F_d$ resulting in height $h_d$, both as described in connection with FIG. 4).

Further, during Step 502, the wire bonding tool may be being positioned above, and not in contact with, a workpiece on the wire bonding machine. Alternatively, during Step 502, the wire bonding tool may be in contact with a workpiece on the wire bonding machine.

At optional Step 504, a response is provided if the accuracy of the bonding force monitored during Step 502 is not within an acceptable range. For example, the response may include at least one of: (a) providing an alarm to a machine operator, (b) providing a warning to the machine operator, (c) providing an error message to the machine operator, (d) ceasing operation of the wire bonding machine, and (e) automatically adjusting the bonding force of the wire bonding machine.

Figure 6:
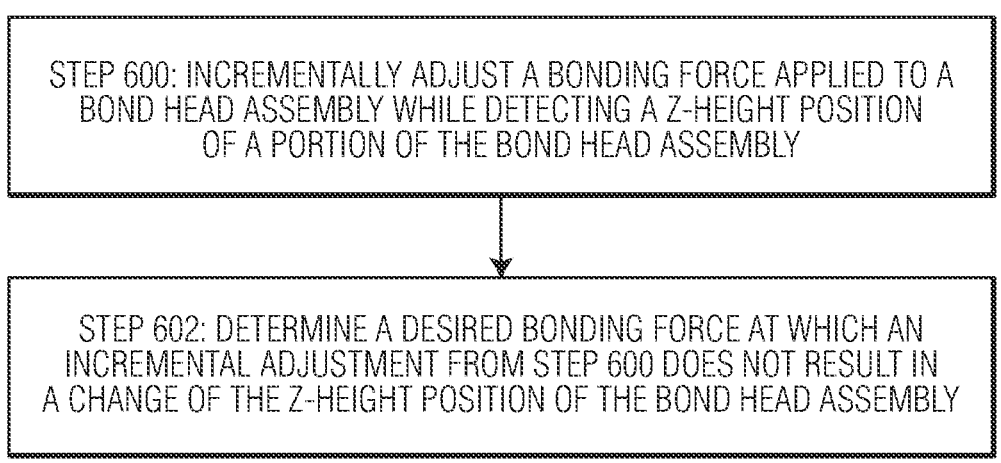

Referring now to FIG. 6, another method of operating a wire bonding machine is illustrated. At Step 600, a bonding force applied to a bond head assembly is incrementally adjusted (e.g., incrementally increasing the bonding force, incrementally decreasing the bonding force, both incrementally increasing and decreasing the bonding force, etc.) while detecting a z-height position of a portion of the bond head assembly. At Step 602, a desired bonding force is determined at which an incremental adjustment from Step 600 does not result in a change of the z-height position of the bond head assembly. For example, the desired bonding force may be a zero gram force. An alternative to Step 602 would be to determine the desired force at an applied force where an incremental adjustment from Step 600 results in a peak z-height position of the bond head assembly (e.g., force $F_b$ resulting in height $h_b$, force $F_d$ resulting in height $h_d$, both as described in connection with FIG. 4).

As will be appreciated by those skilled in the art, Steps 600 and 602 may be repeated for a plurality of cycles until the desired bonding force is determined at a stable value by a wire bonding machine at Step 602. Further, Steps 600 and 602 may occur during a force control mode (or a position control mode) of operation of a wire bonding machine.

Figure 7:
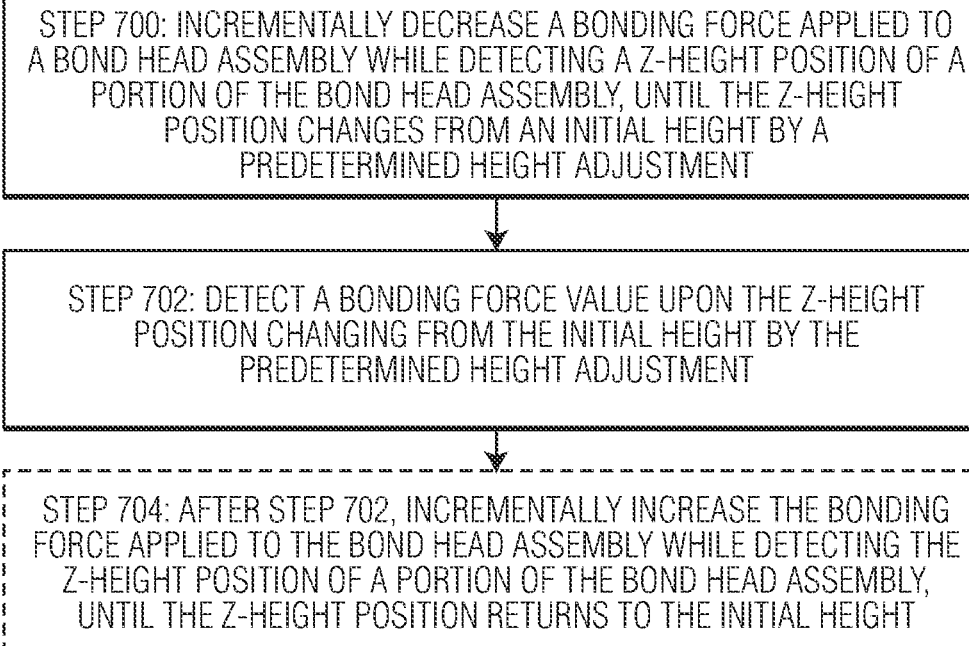

Referring now to FIG. 7, yet another method of operating a wire bonding machine is illustrated. At Step 700, a bonding force applied to a bond head assembly is incrementally decreased while detecting a z-height position of a portion of the bond head assembly, until the z-height position changes from an initial height (e.g., $h_{init}$) by a predetermined height adjustment (e.g., see height adjustment to height $h_a$ in FIG. 1B and FIG. 3B). At Step 702, a bonding force value (e.g., see $F_a$ in FIG. 4, referring to $h_a$ from FIG. 1B or FIG. 3B) is detected upon the z-height position changing from the initial height by the predetermined height adjustment. At optional Step 704, after Step 702, the bonding force applied to the bond head assembly is incrementally increased while detecting the z-height position of a portion of the bond head assembly, until the z-height position returns to the initial height (e.g., see return to $h_{init}$ in FIG. 1C and FIG. 3D, corresponding to bonding force $F_c$ from FIG. 4).

After Step 700, the z-height position may continue to change until it reaches a peak height position (e.g., see height $h_b$ from FIG. 3C, corresponding to bonding force value $F_b$).

Further, Steps 700 and 702 may occur during a force control mode (or a position control mode) of operation of a wire bonding machine.

Figure 8:
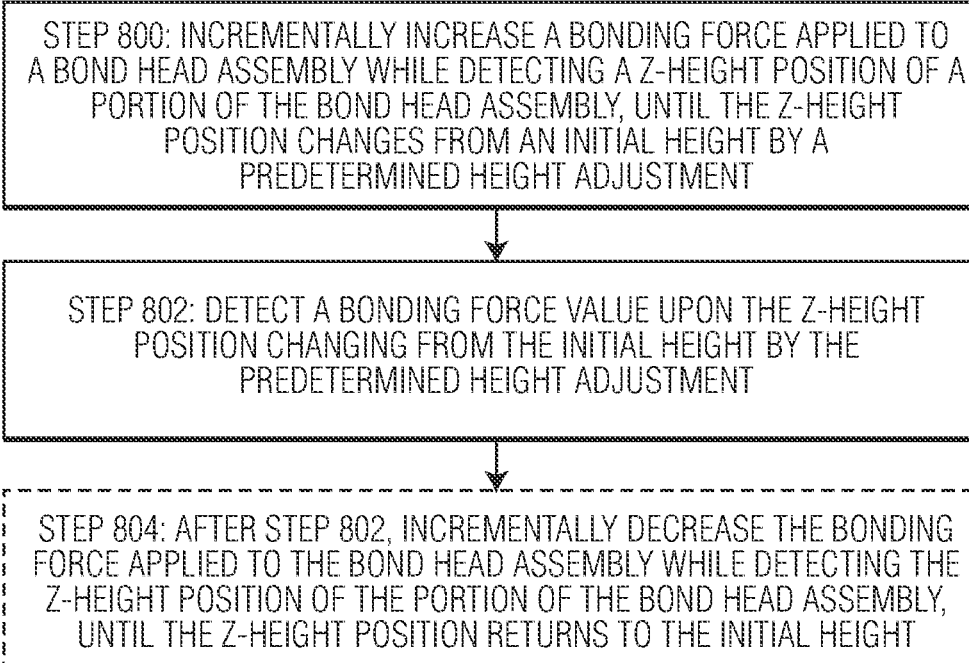

Referring now to FIG. 8, yet another method of operating a wire bonding machine is illustrated. At Step 800, a bonding force applied to a bond head assembly is incrementally increased while detecting a z-height position of a portion of the bond head assembly, until the z-height position changes from an initial height (e.g., $h_{init}$) by a predetermined height adjustment (e.g., see height adjustment to height $h_a$ in FIG. 2B). At Step 802, a bonding force value (e.g., the bonding force corresponding to height $h_a$ in FIG. 2B) is detected upon the z-height position changing from the initial height by the predetermined height adjustment. At optional Step 804, after Step 802, the bonding force applied to the bond head assembly is incrementally decreased while detecting the z-height position of the portion of the bond head assembly, until the z-height position returns to the initial height (e.g., see return to $h_{init}$ in FIG. 2C). In connection with this Step 804, a bonding force value may be detected upon the z-height position returning to the initial height.

In connection with the method of FIG. 8, after Step 800, the z-height position may continue to change until it reaches a peak height position. At this peak height position, the bonding force value may be detected.

Further, Steps 800 and 802 may occur during a force control mode (or a position control mode) of operation of a wire bonding machine.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of operating a wire bonding machine, the method comprising the steps of:
   (a) operating a wire bonding machine during at least one of (i) an automatic wire bonding operation and (ii) a dry cycle wire bonding operation, wherein a bonding force is applied during the operation of the wire bonding machine; and
   (b) monitoring an accuracy of the bonding force of the wire bonding machine during the at least one of (i) the automatic wire bonding operation and (ii) the dry cycle wire bonding operation.

2. The method of claim 1 further comprising the step of providing a response if the accuracy of the bonding force monitored during step (b) is not within an acceptable range.

3. The method of claim 2 wherein the response includes at least one of: (a) providing an alarm to a machine operator; (b) providing a warning to the machine operator; (c) providing an error message to the machine operator; (d) ceasing operation of the wire bonding machine; and (e) automatically adjusting the bonding force of the wire bonding machine.

4. The method of claim 1 wherein step (b) occurs during a force control mode of operation of the wire bonding machine.

5. The method of claim 1 wherein, in connection with step (b), an accurate zero gram force is determined.

6. The method of claim 1 wherein, in connection with step (b), a desired force is determined at which an incremental adjustment from step (b) does not result in a change of the z-height position of the bond head assembly.

7. The method of claim 1 wherein, in connection with step (b), a desired force is determined at which an incremental adjustment from step (b) results in a peak z-height position of the bond head assembly.

8. The method of claim 1 wherein step (b) occurs during a force control mode of operation of the wire bonding machine.

9. The method of claim 1 wherein step (b) includes incrementally decreasing a force applied to a bond head assembly of the wire bonding machine while detecting a z-height position of a portion of the bond head assembly, until the z-height position changes from an initial height by a predetermined height adjustment.

10. The method of claim 9 wherein, in connection with step (b), a force value is detected upon the z-height position changing from the initial height by the predetermined height adjustment.

11. The method of claim 9 wherein the process of incrementally decreasing the force may be repeated for a plurality of cycles, wherein each of the plurality of cycles is used in connection with the monitoring of the accuracy of the bonding force.

12. The method of claim 1 wherein step (b) includes incrementally increasing a force applied to a bond head assembly of the wire bonding machine while detecting a z-height position of a portion of the bond head assembly, until the z-height position changes from an initial height by a predetermined height adjustment.

13. The method of claim 12 wherein, in connection with step (a), a force value is detected upon the z-height position changing from the initial height by the predetermined height adjustment.

14. The method of claim 12 wherein the process of incrementally increasing the force may be repeated for a plurality of cycles, wherein each of the plurality of cycles is used in connection with the monitoring of the accuracy of the bonding force.

15. The method of claim 1 wherein step (b) occurs during a position control mode of operation of the wire bonding machine.

16. The method of claim 15 wherein, in connection with step (b), an accurate zero gram force is determined.

17. The method of claim 15 wherein a characteristic of a z-axis driving force is determined while substantially maintaining a predetermined z-axis position to monitor the accuracy of the bonding force.

18. The method of claim 17 wherein the characteristic is an electrical characteristic of a z-axis motor.

19. The method of claim 18 wherein the characteristic is an electrical current of a z-axis motor providing the driving force.

20. The method of claim 1 wherein step (b) occurs with a wire bonding tool being positioned above, and not in contact with, a workpiece on the wire bonding machine.

21. The method of claim 1 wherein step (b) occurs with a wire bonding tool being in contact with a workpiece on the wire bonding machine.

22. A method of operating a wire bonding machine, the method comprising the steps of:
   (a) incrementally adjusting a bonding force applied to a bond head assembly while detecting a z-height position of a portion of the bond head assembly; and
   (b) determining a desired bonding force at which an incremental adjustment from step (a) does not result in a change of the z-height position of the bond head assembly.

23. The method of claim 22 wherein the desired bonding force is a zero gram force.

24. The method of claim 22 wherein step (a) includes at least one of incrementally increasing the bonding force and incrementally decreasing the bonding force.

25. The method of claim 22 wherein step (a) includes both incrementally increasing the bonding force and incrementally decreasing the bonding force.

26. The method of claim 22 wherein steps (a) and (b) are repeated for a plurality of cycles until the desired bonding force is determined at a stable value by a wire bonding machine.

27. The method of claim 22 wherein steps (a) and (b) occur during a force control mode of operation of a wire bonding machine.

28. The method of claim 22 wherein the desired bonding force results in a peak z-height position of the bond head assembly.

29. A method of operating a wire bonding machine, the method comprising the steps of:
   (a) incrementally adjusting a bonding force applied to a bond head assembly while detecting a z-height position of a portion of the bond head assembly; and
   (b) determining a desired bonding force at which an incremental adjustment from step (a) results in a peak z-height position of the bond head assembly.

30. The method of claim 29 wherein the desired bonding force is a zero gram force.

31. The method of claim 29 wherein step (a) includes at least one of incrementally increasing the bonding force and incrementally decreasing the bonding force.

32. The method of claim 29 wherein step (a) includes both incrementally increasing the bonding force and incrementally decreasing the bonding force.

33. The method of claim 29 wherein steps (a) and (b) are repeated for a plurality of cycles until the desired bonding force is determined at a stable value by a wire bonding machine.

34. The method of claim 29 wherein steps (a) and (b) occur during a force control mode of operation of a wire bonding machine.

* * * * *